(12) United States Patent
Lee et al.

(10) Patent No.: US 9,543,001 B1
(45) Date of Patent: Jan. 10, 2017

(54) PROGRAMMING MEMORY CELLS

(71) Applicant: Macronix International Co., Ltd., Hsinchu (TW)

(72) Inventors: Ya Jui Lee, Taichung (TW); Kuan Fu Chen, Taipei (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 14/985,622

(22) Filed: Dec. 31, 2015

(51) Int. Cl.
*G11C 16/06* (2006.01)
*G11C 11/56* (2006.01)
*G11C 16/34* (2006.01)
*G11C 16/10* (2006.01)
*G11C 16/26* (2006.01)

(52) U.S. Cl.
CPC ........ *G11C 11/5628* (2013.01); *G11C 11/5642* (2013.01); *G11C 16/10* (2013.01); *G11C 16/26* (2013.01); *G11C 16/3459* (2013.01)

(58) Field of Classification Search
CPC ............. G11C 11/5628; G11C 16/3459; G11C 16/3418; G11C 16/10; G11C 2211/5621; G11C 16/0483; G11C 16/3454; G11C 5/147; G11C 8/10; G11C 16/04; G11C 11/5621; G11C 11/56; G11C 11/5635; G11C 11/5642

USPC ........................ 365/185.03, 185.19, 185.24, 185.22, 365/185.28, 185.09, 185.21, 185.29, 185.02, 365/185.18, 195, 196, 185.25, 189.09, 203, 222

See application file for complete search history.

(56) References Cited

U.S. PATENT DOCUMENTS 9,064,580 B2   6/2015  Senoo et al.
2009/0285022 A1* 11/2009  Cho ................... G11C 11/5628
                                              365/185.03

* cited by examiner

*Primary Examiner* — Thong Q Le
(74) *Attorney, Agent, or Firm* — Fish & Richardson P.C.

(57) ABSTRACT

First threshold voltages of one or more memory cells in a memory array are obtained. For each memory cell in the one or more memory cells, a target threshold voltage for the memory cell is identified. A number of programming shots to reach the target threshold voltage of the memory cell is determined based on the first threshold voltage of the memory cell. Respective number of programming shots, which are determined for the one or more memory cells, are applied to the one or more memory cells. Whether respective target threshold voltages for the one or more memory cells are reached is verified upon applying the respective number of programming shots to the one or more memory cells.

18 Claims, 6 Drawing Sheets

PROGRAMMING MEMORY CELLS

TECHNICAL FIELD

The following disclosure relates generally to programming memory cells.

BACKGROUND

Memory arrays can be programmed by applying a set of voltage pulses to the memory cells in a programming cycle. A voltage pulse is accompanied by a program verify operation to determine whether the memory cells are correctly programmed. In some memory arrays, e.g., high-density NAND flash memory chips, the aggregate time required to perform multiple program verify operations can be a large percentage of the overall memory programming time.

SUMMARY

The present disclosure describes devices, systems and techniques for improving memory performance by reducing the time taken for program verify operations when programming memory cells. In one implementation, a pre-verify operation is performed during memory programming to determine a number of voltage pulses (referred to as "programming shots") to be applied to the memory cells to reach corresponding target threshold voltage levels. In such an implementation, programming of one or more memory cells in a memory array is initiated by applying a first programming shot to the memory cells. The current threshold voltage for each memory cell is determined after the application of the first programming shot. Based on the current threshold voltage, an additional number of programming shots needed for each memory cell to reach its target threshold voltage level is computed. The respective number of programming shots computed for each memory cell is applied without intermediate program verify operations between the applications of the programming shots. After the respective numbers of programming shots have been applied to the memory cells, a program verify operation is performed to determine whether the memory cells have been programmed to their corresponding target voltage levels.

In a general aspect, first threshold voltages of one or more memory cells in a memory array are obtained. For each memory cell in the one or more memory cells, a target threshold voltage for the memory cell is identified. A number of programming shots to reach the target threshold voltage of the memory cell is determined based on the first threshold voltage of the memory cell. Respective number of programming shots, which are determined for the one or more memory cells, are applied to the one or more memory cells. Whether respective target threshold voltages for the one or more memory cells are reached is verified upon applying the respective number of programming shots to the one or more memory cells.

Particular implementations may include one or more of the following features. Obtaining the first threshold voltages of the one or more memory cells may comprise applying a first programming shot to the one or more memory cells, and obtaining the first threshold voltages of the one or more memory cells upon applying the first programming shot.

Obtaining the first threshold voltages of the one or more memory cells may comprise determining a distribution of the first threshold voltages of the one or more memory cells, and grouping the distribution of the first threshold voltages into N groups based on programming speed. Determining the number of programming shots to reach the target threshold voltage of a memory cell may comprise identifying a first group of the N groups corresponding to the first threshold voltage of the memory cell, and determining the number of programming shots to apply to the first group to reach the target threshold voltage of the memory cell.

Applying the respective number of programming shots to the one or more memory cells may comprise applying, to the one or more memory cells, the respective number of programming shots in successive operations without intermediate program verify operations.

Obtaining the first threshold voltages of the one or more memory cells may comprise storing the first threshold voltages of the one or more memory cells in a cache memory. Determining the number of programming shots to reach the target threshold voltage of each memory cell may comprise storing, in the cache memory, respective number of programming shots for each memory cell to reach a corresponding target threshold voltage.

Applying, to the one or more memory cells, the respective number of programming shots may comprise reading, for each memory cell and from the cache memory, the number of programming shots to reach the respective target threshold voltage. The number of programming shots read from the cache memory may be applied to the memory cell in successive operations.

Verifying whether respective target threshold voltages are reached for the one or more memory cells may comprise performing a first program verify operation to determine whether respective target threshold voltages are reached for the one or more memory cells upon applying penultimate programming shots to the one or more memory cells. Final programming shots to memory cells that have not reached respective target threshold voltages may be applied. A second program verify operation may be performed to determine whether the respective target threshold voltages are reached for the memory cells.

Verifying whether respective target threshold voltages are reached for the one or more memory cells may comprise obtaining second threshold voltages of the one or more memory cells upon applying penultimate programming shots to the one or more memory cells. For each memory cell in the one or more memory cells, additional number of programming shots to reach the respective target threshold voltage may be determined based on the second threshold voltage of the memory cell. Respective additional number of programming shots may be applied to the one or more memory cells in successive operations. Whether respective target threshold voltages are reached for the one or more memory cells may be verified upon applying the respective additional number of programming shots to the one or more memory cells.

Implementations of the above techniques include devices, systems, methods, computer program products and computer-readable media. One such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above described actions. One such device comprises a memory controller that is configured to perform the above-described operations. The device may include a cache memory configured to store first threshold voltages of the one or more memory cells and respective number of programming shots for each memory cell.

By reducing or removing intermediate program verify operations between programming shots in a programming cycle, the devices, systems and techniques described herein can lead to a reduction in the overall memory programming time. Accordingly, programming throughput performance of the memory array, e.g., speed of writing data to or erasing data from the memory array, can be improved. The devices, systems and techniques described herein can be applied to various types of nonvolatile memory arrays, such as NAND flash memory or NOR flash memory, among others. Such memory may include single-level cells (SLCs) or multi-level cells (MLCs), e.g., triple-level cells (TLCs) or quadruple-level cells (QLCs), among others.

The details of one or more disclosed implementations are set forth in the accompanying drawings and the description below. Other features, aspects, and advantages will become apparent from the description, the drawings and the claims.

DETAILED DESCRIPTION

A memory cell in a memory array, such as a NAND flash memory chip, can be programmed, e.g., data can be written to or erased from the memory cell, by applying a set of voltage pulses, also referred to as programming shots, to the memory cell in a programming cycle. The programming shots are applied in incremental steps until a target threshold voltage level is reached for the memory cell. When writing to the memory cell, the target threshold voltage level corresponds to a voltage level of the memory cell that corresponds to the bits of data to be written to the memory cell. When erasing data from the memory cell, the target threshold voltage level corresponds to a voltage level used to reset the memory cell to an erased state.

The voltage level of each programming shot can be a fraction of the target threshold voltage level. After each programming shot, a program verify operation is generally performed to determine whether the target threshold voltage is reached and, accordingly, whether data was correctly written to or erased from the memory cell. If the target threshold voltage level is not reached, another programming shot is applied to adjust the voltage level in the memory cell towards the target threshold voltage level, followed by a program verify operation. The process is repeated until the target threshold voltage level is reached for the memory cell.

Figure 1:
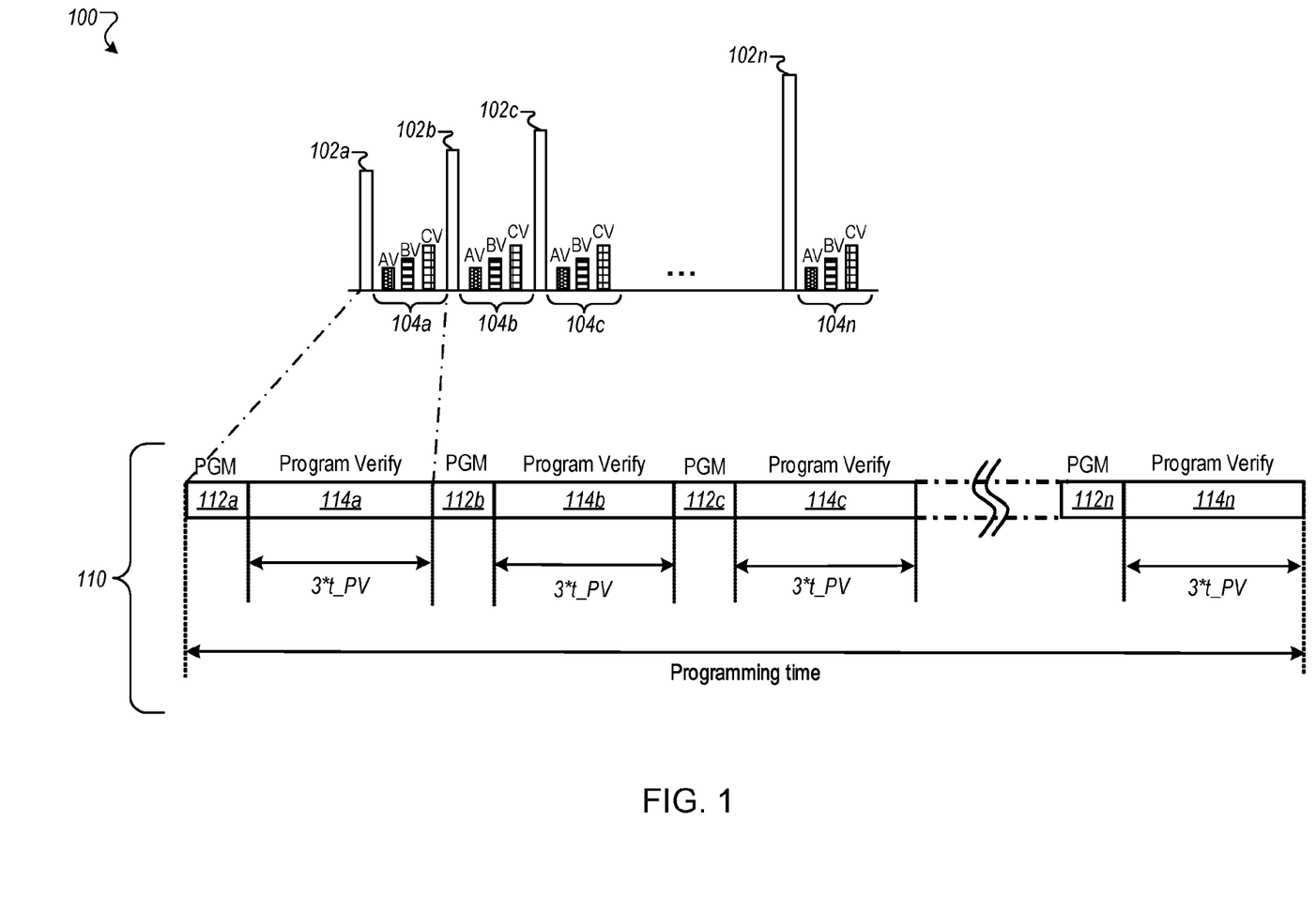
FIG. 1 illustrates an example of a memory programming cycle with intermediate program verify operations following each programming shot.

FIG. 1 illustrates an example of a memory programming cycle 100 with intermediate program verify operations following each programming shot. The programming cycle 100 includes a plurality of n programming shots (where n is an integer>1), e.g., 102a, 102b, 102c, and up to 102n, to program memory cells in a memory array, e.g., a flash memory chip. The programming cycle 100 also includes a plurality of program verify operations, e.g., 104a, 104b, 104c, and up to 104n.

Application of each programming shot in the programming cycle 100 is followed by a program verify operation to determine the voltage levels in the target memory cells in the memory array. For example, programming shot 102a is followed by program verify operation 104a, programming shot 102b is followed by program verify operation 104b, programming shot 102c is followed by program verify operation 104c and programming shot 102n is followed by program verify operation 104n.

In some situations, the memory cells in the memory array are multi-level cells (MLCs). In such cases, the target threshold voltage levels for different cells can be different, e.g., corresponding to the different values for the memory bits in the memory cells. For example, the target threshold voltage levels for the memory cells in the memory array can be one of three levels—A-level, B-level or C-level. In such cases, each program verify operation measures the voltage levels for the memory cells for each of A-level (A-verify or "AV", as shown), B-level (B-verify or "BV") and C-level (C-verify of "CV"). Due to the multiple levels of verification, the time for each program verify operation can be increased and lead to an overall increase in the time required to perform the multiple program verify operations.

The sequence 110 illustrates the time taken for the programming cycle 100. Each programming shot ("PGM") uses a finite amount of time. For example, the first programming shot 102a takes time 112a, the second programming shot 102b takes time 112b, the third programming shot 102c takes time 112c, and the n-th programming shot 102n takes time 112n. As described herein, time is measured in some appropriate unit, such as seconds, milliseconds, microseconds or nanoseconds.

The time taken by each programming shot is followed by a time taken for a program verify operation associated with the programming shot. For example, as shown in FIG. 1, the first programming shot time 112a is followed by time 114a taken by the program verify operation 104a associated with the first programming shot 102a. Similarly, the second programming shot time 112b is followed by time 114b taken by the program verify operation 104b associated with the second programming shot 102b; the third programming shot time 112c is followed by time 114c taken by the program verify operation 104c associated with the third programming shot 102c; and the n-th programming shot time 112n is followed by time 114n taken by the program verify operation 104n associated with the n-th programming shot 102n.

The program verify operation for each threshold voltage level takes time t_PV. Accordingly, for a memory array with multi-level cells using the three levels A-level, B-level or C-level, each program verify operation takes 3*t_PV, as shown (t_PV for each of AV, BV and CV). For a total n programming shots, the aggregate program verify time used is n*3*t_PV, which can be a large percentage of the overall programming time for the memory programming cycle 100.

In some applications, it may be desirable to reduce the overhead of the program verify time in a programming cycle. For example, solid-state-drives (SSDs), smart phones, tablet computers, and data storage servers, among others, require nonvolatile memory arrays (e.g., high-density flash memory chips) with high throughputs to achieve desired system performance. The high throughputs can be realized by increasing the programming speed of the memory arrays, e.g., by reducing the aggregate time taken by the program verify operations.

The following sections disclose memory arrays, and associated devices, systems and techniques, in which the programming speed of a memory array is increased by limiting the number of program verify operations in a programming cycle, thereby reducing the aggregate program verify time in each programming cycle. In one implementation, the devices, systems and techniques described in the following sections are applied to nonvolatile memory arrays, e.g., flash memory chips. However, in other implementations, the devices, systems and techniques described in the following sections can also be applied to other types of memory.

Figure 2:
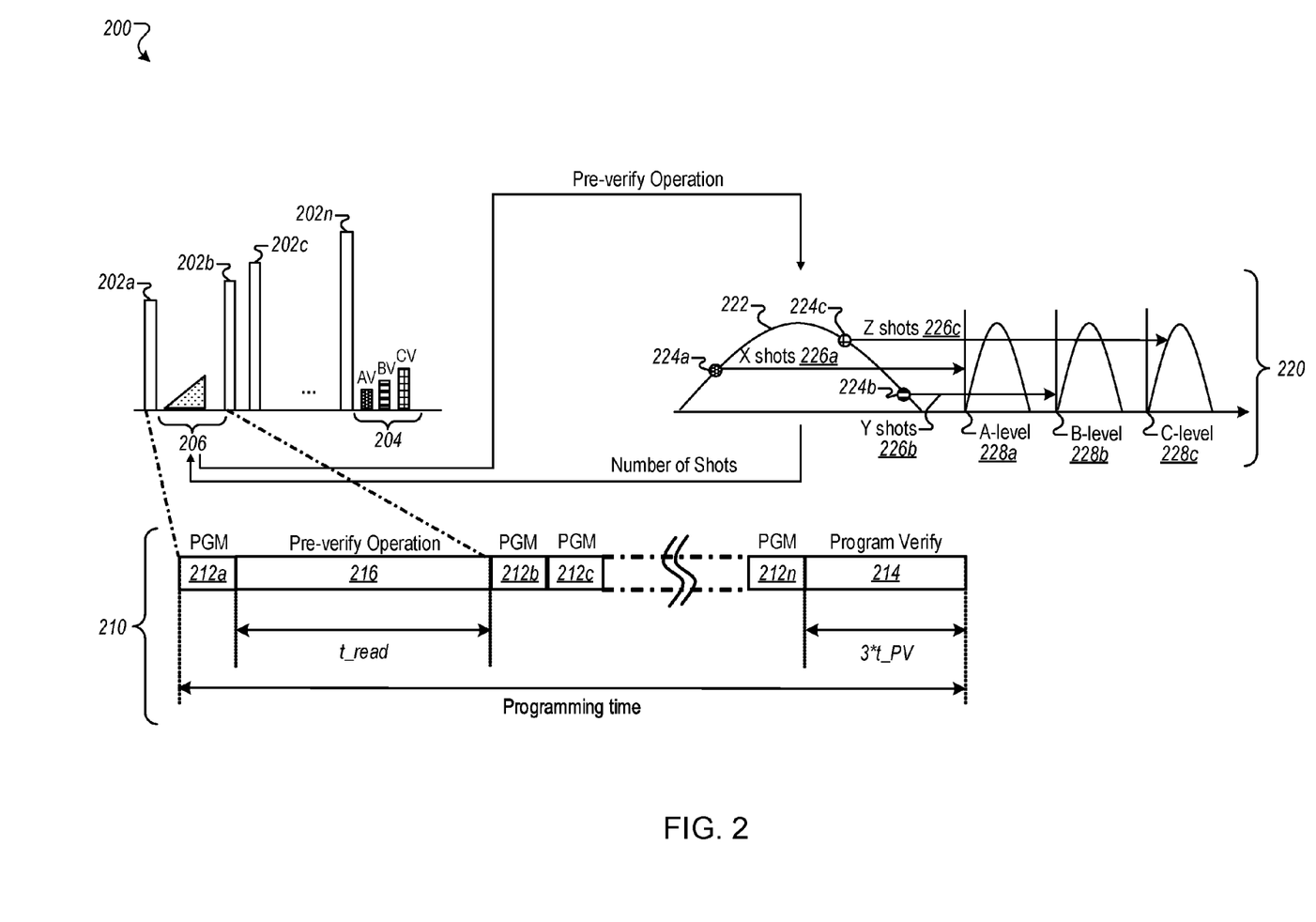
FIG. 2 illustrates an example of a memory programming cycle with a pre-verify operation and consecutive programming shots without intermediate program verify operations, according to one implementation.

FIG. 2 illustrates an example of a memory programming cycle 200 with a pre-verify operation and consecutive programming shots without intermediate program verify operations, according to one implementation. The programming cycle 200 can be used to program memory cells in a memory array, e.g., a flash memory chip. The programming cycle 200 can be used to program single-level cells, multi-level cells, or both. The operations of the programming cycle, including the pre-verify operation 206, is performed by some appropriate logic in a system associated with the memory array that is to be programmed. For example, the following implementation describes a memory controller performing the operations of the programming cycle 200 to program a memory array associated with the memory controller. However, in other implementations, the operations of the programming cycle 200 may be performed by other hardware and/or software in a system associated with a memory array that is programmed.

The programming cycle 200 includes a plurality of programming shots, e.g., 202a, 202b, 202c, up to 202n, to program the memory cells. The programming cycle 200 also includes a program verify operation 204, and a pre-verify operation 206.

In programming a memory array using the programming cycle 200, the memory controller applies an initial programming shot to the memory cells in the array and then obtains a threshold voltage for each memory cell, based on which numbers of programming shots to be used to reach the respective target threshold voltages for the memory cells are determined. For example, a first programming shot 202a is applied to the target memory cells of the memory array, which is followed by the pre-verify operation 206. As part of the pre-verify operation 206, the memory controller obtains the threshold voltage for each memory cell following application of the first programming shot 202a. For example, in one implementation, a page buffer reads out to cache threshold voltages from the memory cells after applying the first programming shot 202a. The threshold voltage data is then transferred to the memory controller. Based on the threshold voltage of each memory cell, the memory controller determines, during the pre-verify operation 206, a number of programming shots to be applied to each memory cell to reach its respective target threshold voltage.

In a multi-level cell (MLC) memory array, the target threshold voltages for the different memory cells can be different, depending on the states of the memory bits in the different memory cells for representing data. For example, as shown in FIG. 2, the target threshold voltage levels for the memory cells in the memory array can be one of three levels—A-level, B-level or C-level. On the other hand, in a single-level cell (SLC) memory array, the target threshold voltages for the memory cells may be a uniform value that is same for all of the memory cells. Thus, the memory controller can determine numbers of programming shots for MLCs, SLCs, or both, during the pre-verify operation 206.

The pre-verify operation 206 is described in greater detail in 220 considering MLCs with three target threshold voltage levels (e.g., A-level, B-level, and C-level). During the pre-verify operation 206, the memory controller measures an initial threshold voltage distribution 222 of the memory cells. As described in this implementation, the initial threshold voltage distribution 222 is the threshold voltage levels of the memory cells following application of the first programming shot 202a. For each memory cell, based on its initial threshold voltage level, the number of programming shots to be applied to reach the target threshold voltage for each cell is determined. For example, if the initial threshold voltage level of a memory cell is at 224a in the distribution 222 and the target threshold voltage level for the memory cell is at A-level 228a, then the memory controller determines that X programming shots 226a is to be applied to the memory cell to move its threshold voltage level from 224a to the target level 228a. Similarly, for a memory cell with initial threshold voltage level 224b, Y programming shots 226b are to be applied the memory cell to move its threshold voltage level to the target B-level 228b, and for a memory cell with initial threshold voltage level 224c, Z programming shots 226c are to be applied the memory cell to move its threshold voltage level to the target C-level 228c.

Figure 3:
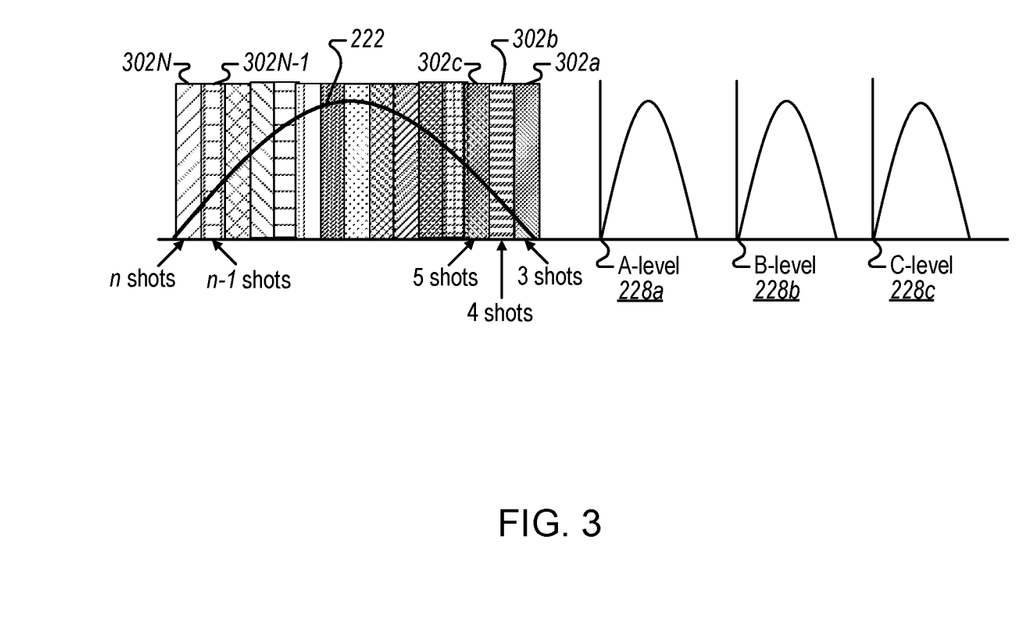
FIG. 3 illustrates an example of grouping initial voltage distribution into a number of groups during the pre-verify operation, according to one implementation.

In this manner, during the pre-verify operation 206, the number of programming shots required for each memory cell to reach its target threshold voltage are determined for each memory cell that is to be programmed. In one implementation, the initial threshold voltage distribution is divided or grouped into a number of groups. For a memory cell, depending on which group the initial threshold voltage of the memory cell corresponds to, the number of programming shots for the memory cell is determined. FIG. 3 illustrates an example of grouping the initial voltage distribution 222 into a number of groups during the pre-verify operation 206, according to one implementation. As shown, the initial voltage distribution 222 is divided into N groups 302a, 302b, 302c, . . . 302N−1 and 302N (where N is a suitable integer). The N groups cover the range of possible values for the initial threshold voltages of the memory cells that are to be programmed. In one implementation, the grouping into N groups is based on the speed with which memory cells can be programmed to the target threshold voltage levels based from their initial threshold voltage levels.

The number of groups, i.e., value of the integer N, is based on a tradeoff between the granularity of precision that is desired in the number of programming shots for each initial threshold voltage level on the voltage distribution curve 222, and the time taken to determine the number of programming shots for each memory cell, once its corresponding group and target threshold voltage level is known. If N is too small (e.g., 2 or 3), there will be fewer number of groups. In such cases, two memory cells with considerably divergent initial threshold voltage levels (e.g., which may otherwise correspond to groups 202a and 202c) may fall in the same group, such that the number of programming shots applied to both cells is the same (assuming identical target threshold voltage levels). This can lead to incorrect programming of a memory cell, e.g., if excess number of shots are applied to a memory cell such that it moves to a different threshold voltage level than the target threshold voltage level. On the other hand, if N is too large (e.g. greater than 45), then the time taken to assign the different memory cells to one of the N groups and determine the number of programming shots for each memory cell can be large. In such a case, the overall time for the pre-verify operation 206 may be comparable or in some cases take more time to complete than the intermediate program verify operations that the pre-verify operation 206 is intended to replace. In such cases, the performance advantages (e.g., as described below) of replacing the intermediate program verify operations with the pre-verify operation 206 may be lost.

Accordingly, the number of groups N is configured to be some suitable value, based on weighing the time taken to determine the number of programming shots for each memory cell during the pre-verify operation 206, and precision desired in the number of programming shots for each initial threshold voltage level on the voltage distribution curve 222. For example, in one implementation the initial threshold voltage distribution is grouped into 15 groups (N=15). Other values are also possible. For example, N can be an integer in the range 4-45, or some other suitable range.

In one implementation, the total number of groups N is determined by partitioning the range for the initial voltage distribution into smaller portions, and assigning each portion to one group. For example, the range for the initial voltage distribution may be 4.5 volts, which may be partitioned into 0.3 volt increments. Considering the above values, the total number of groups N will be 4.5/0.3=15. In one implementation, the voltage range for each partition (e.g., 0.3 volts) corresponds to the amount of voltage that is applied in each programming shot.

For each group, the memory controller determines the number of programming shots to apply to reach a particular target threshold voltage. For example, as shown, if the initial threshold voltage of a memory cell is in the group 302a, 3 programming shots will be applied to reach target threshold voltage level AV 228a; if the initial threshold voltage is in the group 302b, 4 programming shots will be applied to reach AV 228a; if the initial threshold voltage is in the group 302N-1, n-1 programming shots will be applied to reach AV 228a; if the initial threshold voltage is in the group 302N, n programming shots will be applied to reach AV 228a, and so on.

In one implementation, the memory controller pre-computes the N groups for the memory cells in the memory array associated with the memory controller and determines the number of programming shots needed for each group to reach a target threshold voltage level. For a memory array with MLCs, the memory controller computes, for each group and for each threshold voltage level, the number of programming shots needed to reach the target threshold voltage for that particular level. Accordingly, for three levels, there may be three different numbers for the programming shots needed for each group to reach the different target threshold voltages.

In one implementation, the memory controller pre-computes and stores the N groups and the corresponding number of programming shots in memory. Subsequently, during a pre-verify operation in a programming cycle, e.g., pre-verify operation 206 in programming cycle 200, the memory controller determines the initial threshold voltage levels for the memory cells to be programmed and assigns each memory cell to one of the N groups based on the initial threshold voltage of the memory cell. In case of MLCs, for each memory cell, the memory controller determines the number of programming shots it will apply based on the assigned group and the target threshold voltage for the memory cell. In case of SLCs, for each memory cell, the memory controller determines the number of programming shots it will apply based on the assigned group.

In this manner, by grouping the initial voltage distribution of the memory cells into a finite number of groups, a finite range of possibilities for the number of programming shots can be achieved. Two memory cells may have different initial threshold voltages, but they may be in the same group, e.g., 302a, if their initial threshold voltages fall within the range covered by the group 302a. Accordingly, if the target threshold voltage levels for the two memory cells are the same, the same number of programming shots can be applied to the two memory cells, even though their initial threshold voltage levels are different.

Upon determining the number of programming shots to be applied to each memory cell during the pre-verify operation 206, the memory controller applies the determined numbers of programming shots to the respective memory cells to reach their respective target threshold voltage levels. The programming shots are applied consecutively to the memory cells without intermediate program verify operations. For example, as shown in FIG. 2, programming shots 202b, 202c, up to 202n, are applied to the memory cells of the memory array in successive operations, without any intermediate program verify operations between the applications of the programming shots. For each memory cell, the number of programming shots applied is based on the number of programming shots determined for the particular memory cell by the pre-verify operation 206 as discussed above.

Following application of the final programming shot, e.g., 202n, the memory controller performs a program verify operation in the programming cycle 200. For example, the memory controller performs program verify operation 204 following the final programming shot 202n. The program verify operation 204 verifies that the memory cells in the memory array have been programmed to their target threshold voltage levels.

The sequence 210 illustrates the time taken for the programming cycle 200. Each programming shot ("PGM") uses a finite amount of time. For example, as described above, the programming cycle 200 applies n (where n is an integer>1) programming shots to reach the target threshold voltages of the memory cells. The first programming shot 202a takes time 212a, the second programming shot 202b takes time 212b, the third programming shot 202c takes time 212c, the n-th programming shot 202n takes time 212n, and so on.

The time 212a taken by the first programming shot is followed by a time 216 taken for pre-verify operation 206. This is followed consecutively by the times 212b, 212c, up to 212n, taken by the remaining programming shots 202b, 202c, up to 202n, respectively. The n-th or final programming shot time 212n is followed by time 214 taken by the program verify operation 204 included in the programming cycle 200.

The pre-verify operation 206 takes time t_read. For an initial voltage distribution that is grouped into N groups as discussed above with respect to FIG. 3, t_read=N*t_PV. For a memory array with multi-level cells using the three levels (e.g., A-level, B-level or C-level), the program verify operation 204 takes 3*t_PV, as shown (t_PV for each of AV, BV and CV). The aggregate time taken by these two operations is t_read+3*t_PV=N*t_PV+3*t_PV, which can be substantially less than the aggregate program verify time n*3*t_PV used in the programming cycle 100.

As an illustrative example of the savings in time that can be realized by using the pre-verify operation 206 and removing the intermediate program verify operations, consider a memory array with MLCs in one of three target threshold voltage levels (e.g., A-level, B-level and C-level), and in which 16 programming shots are used to program the memory cells to the highest threshold voltage level (e.g., CV). In this case, the total verify time in the programming cycle 100 is (here n=16):

$$16 \text{ shots} * 3 \text{ states} * t\_PV = 48 \ t\_PV \quad (1)$$

In contrast, the total verify time in the programming cycle 200 is (assuming that the initial voltage distribution is grouped into 16 groups in the pre-verify operation 206, i.e., N=16):

$$16 \text{ groups} * t\_PV + 1 \text{ shot} * 3 \text{ states} * t\_PV = 19 \ t\_PV \quad (2)$$

19 t_PV is approximately 40% of 48 t_PV. Accordingly, in this example, using the programming cycle 200 with the pre-verify operation 206 leads to a 60% reduction in the verify time compared to using the programming cycle 100 with the intermediate program verify operations 104a, 104b and 104c.

In this manner, the total memory programming time for the programming cycle 200 can be reduced, compared to the total memory programming time for the programming cycle 100. As described above, the reduction can be achieved by replacing the plurality of intermediate program verify operations (e.g., 104a, 104b and 104c as in the programming cycle 100 of FIG. 1), by an initial pre-verify operation (e.g., 206), followed by a series of consecutive programming shot applications without intermediate program verify operations (e.g., 202b, 202c, . . . 202n). A program verify operation (e.g., 204) can be performed following application of the final programming shot 202n.

In the implementation illustrated above, the pre-verify operation 206 is performed after the first programming shot 202a. Alternative implementations are possible. For example, a program verify operation may be performed after the first programming shot 202a, which is followed by the pre-verify operation 206. In this case, the pre-verify operation may follow immediately after the program verify operation that is performed after the first programming shot, or the pre-verify operation may be performed after the second programming shot. In another implementation, the pre-verify operation may be performed after the third programming shot.

Figure 4A:
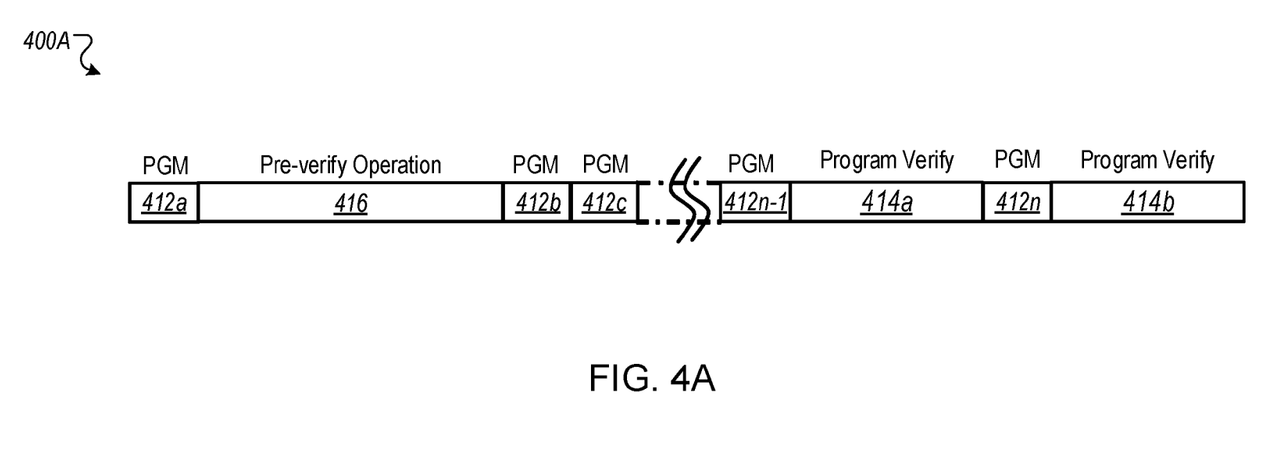
FIGS. 4A and 4B illustrate additional examples of a memory programming cycle with a pre-verify operation and consecutive programming shots without intermediate program verify operations.
Figure 4B:
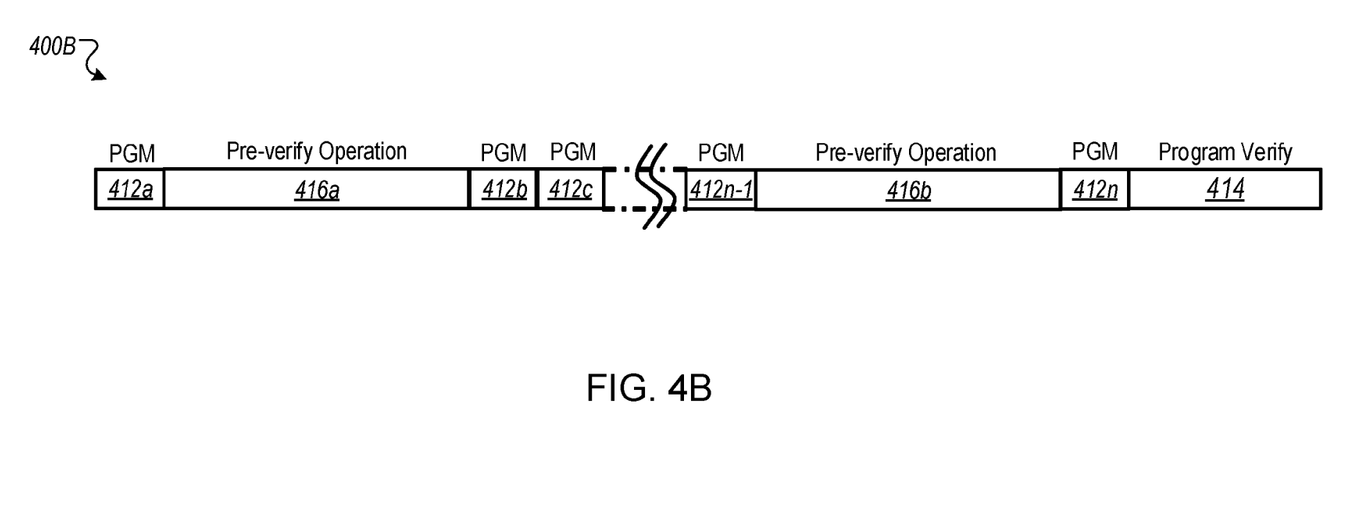

FIGS. 4A and 4B illustrate additional examples of a memory programming cycle with a pre-verify operation and without intermediate program verify operations following each programming shot. In one implementation, a programming cycle includes a pre-verify operation and more than one program verify operation at the end of the programming cycle, as shown by the sequence 400A in FIG. 4A. The programming cycle represented by the sequence 400A includes multiple programming shots indicated by 412a, 412b, 412c, up to 412n−1 and 412n, a pre-verify operation indicated by 416, and program verify operations indicated by 414a and 414b.

A memory controller that implements the programming cycle represented by 400A applies the first programming shot, corresponding to 412a, followed by a pre-verify operation corresponding to 416, similar to that described previously with respect to programming cycle 200. Then the memory controller applies consecutive programming shots, indicated by 412b, 412c and 412n−1, without intermediate program verify operations. However, the memory controller performs two program verify operations towards the end of the programming cycle. For example, following the penultimate programming shot, indicated by 412n−1, the memory controller performs a first program verify operation 414a. The first program verify operation, indicated by 414a is used to determine, among other purposes, if additional programming shots are needed to reach the target threshold voltage levels. The final programming shot, indicated by 412n, is applied accordingly, which is followed by a second program verify operation, indicated by 414b, to verify whether the target threshold voltage levels are reached for the memory cells.

In another implementation, the first program verify operation 414a is performed before the penultimate programming shot 412n−1. For example, the first program verify operation 414a can be performed after the m-th programming shot before the final programming shot 412n, where m is an integer>2. In such cases, more than two program verify operations may be performed, e.g., after every programming shot starting at the m-th programming shot, including after the final programming shot.

In one implementation, a programming cycle includes two or more pre-verify operations, as shown by the sequence 400B in FIG. 4B. The programming cycle represented by the sequence 400B includes multiple programming shots indicated by 412a, 412b, 412c, up to 412n−1 and 412n, pre-verify operations indicated by 416a and 416b, and a program verify operation indicated by 414.

A memory controller that implements the programming cycle shown in FIG. 4B applies the first programming shot, corresponding to 412a, followed by a first pre-verify operation corresponding to 416a, similar to that described previously with respect to programming cycle 200. Then the memory controller applies consecutive programming shots, indicated by 412b, 412c and 412n−1, without intermediate program verify operations. However, the memory controller performs a second pre-verify operation towards the end of the programming cycle. For example, following the penultimate programming shot, indicated by 412n−1, the memory controller performs the second pre-verify operation 416b. The second pre-verify operation 416b is used to determine, among other purposes, numbers of additional programming shots, if any, needed to reach the target threshold voltage levels. Accordingly, the final programming shot, indicated by 412n, is applied, which is followed by the program verify operation, indicated by 414, to verify whether the target threshold voltage levels are reached for the memory cells.

In another implementation, the second pre-verify operation 416b is performed before the penultimate programming shot 412n−1. For example, the second pre-verify operation 416b can be performed after the m-th programming shot before the final programming shot 412n, where m is an integer>2. In some of these cases, the programming shots after the second pre-verify operation 416b (e.g., m+1-st programming shot up to the final programming shot) may be applied consecutively without intermediate program verify operations. Alternatively, in some of these cases, two or more program verify operations may be performed following the second pre-verify operation 416b, e.g., after every programming shot starting at the m+1-st programming shot, including after the final programming shot.

The two or more program verify operations 414a and 414b, or the two or more pre-verify operations 416a and 416b, can be useful in situations where the threshold voltage levels fluctuate, and/or noise is introduced during the application of the programming shots 412b, 412c, or 412n–1. In such cases, the threshold voltages in the memory cells may change following the determination of voltage levels during the pre-verify operation after the first programming shot. The first program verify operation 414a, or the additional pre-verify operation 416b, can be used to ensure that there is a narrow distribution of the threshold voltage levels of the memory cells.

Figure 5:
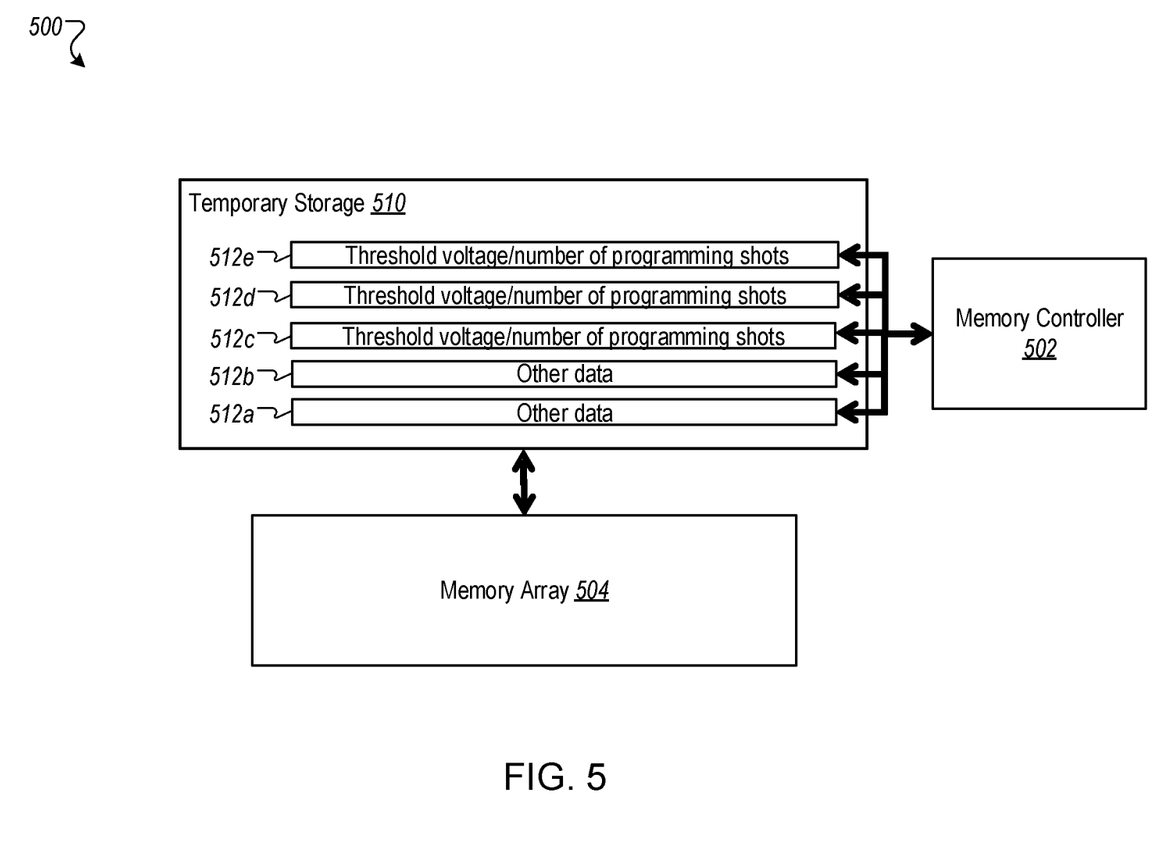
FIG. 5 illustrates an example of a system for using a memory programming cycle with a pre-verify operation and consecutive programming shots without intermediate program verify operations, according to one implementation.

FIG. 5 illustrates an example of a system 500 for using a memory programming cycle with a pre-verify operation and consecutive programming shots without intermediate program verify operations, according to one implementation. The system 500 includes a memory controller 502, a memory array 504 and a temporary storage 510. In one implementation, the memory controller 502 programs the memory array 504 using the programming cycle 200.

The memory controller 502 includes hardware and software logic for performing various operations, which include programming the memory array 504, e.g., writing to or erasing from the memory array 504, or reading from the memory array 504, among other uses. The memory controller 502 may be, for example, a microprocessor that executes instructions for programming the memory array 504. The instructions are stored in suitable storage accessible to the memory controller, e.g., a flash memory module or hard disk, among others. The instructions also can be stored in the temporary storage 510, or in the memory array 504 (e.g., in a dedicated portion of the memory array 504 that is distinct from the memory cells that are programmed with data).

The memory array 504 includes a plurality of memory cells, which can be single-level cells, or multi-level cells. In one implementation, the memory array 504 is a nonvolatile memory array, e.g., a flash memory chip. However, in other implementations the memory array can be some other type of memory.

The temporary storage 510 is configured to store information about the threshold voltages of the memory cells and the number of programming shots to be applied to the memory cells to reach respective target threshold voltage levels. In the implementation shown, the temporary storage 510 is a cache memory that includes caches 512a, 512b, 512c, 512d and 512e. Some of these caches, e.g., 512c-512e, store information about the threshold voltages and the number of programming shots to be applied. Other caches, e.g., 512a and 512b, store other data. However, caches 512a or 512b also can be used to store information about the threshold voltages and the number of programming shots, as needed. Conversely, caches 512c-512e also can be used to store other types of data.

Although only five caches are shown, the temporary storage 510 can hold a different number of caches. For example, in one implementation the temporary storage 510 holds a large number of caches, where the number of caches corresponds to the number of memory cells that are to be programmed in the memory array 504.

The temporary storage 510 also can be other types of storage. For example, the temporary storage 510 can include static random access memory (SRAM), NAND flash memory, or a set of registers. Additionally or alternatively, the temporary storage 510 can be implemented in a portion of the memory array 504, which can be distinct from the memory cells that are to be programmed. Other suitable configurations are possible.

During the pre-verify operation in a programming cycle, e.g. pre-verify operation 206, the threshold voltages of the memory cells in the memory array 504 are read and written to one or more caches in the temporary storage 510, e.g., caches 512c-512e. In one implementation, a cache is associated with each memory cell that is to be programmed and is configured to hold information about the threshold voltage level of the corresponding memory cell, and/or information about the number of programming shots to be applied to the memory cell to reach its target threshold voltage level.

The memory controller 502 reads the threshold voltage information about the memory cells from the caches and determines a number of shots to be applied to the memory cells to reach their target threshold voltage levels, e.g., as described previously with respect to the pre-verify operation 206. The memory controller 502 writes the determined number of shots back to the respective caches. Then the memory controller 502 programs the memory cells in the memory array by applying the determined number of programming shots to the memory cells. For a memory cell, the memory controller 502 reads out the number of programming shots to be applied from the cache that is associated with the memory cell.

In this manner, the system 500 can be used to program a memory array using a programming cycle (e.g., programming cycle 200) that uses a pre-verify operation (e.g., 206) without intermediate program verify operations between programming shots. The system 500 also can be used to program a memory array using other programming cycles that include a pre-verify operation, e.g., a programming cycle that corresponds to the sequence 400A or the sequence 400B.

Figure 6:
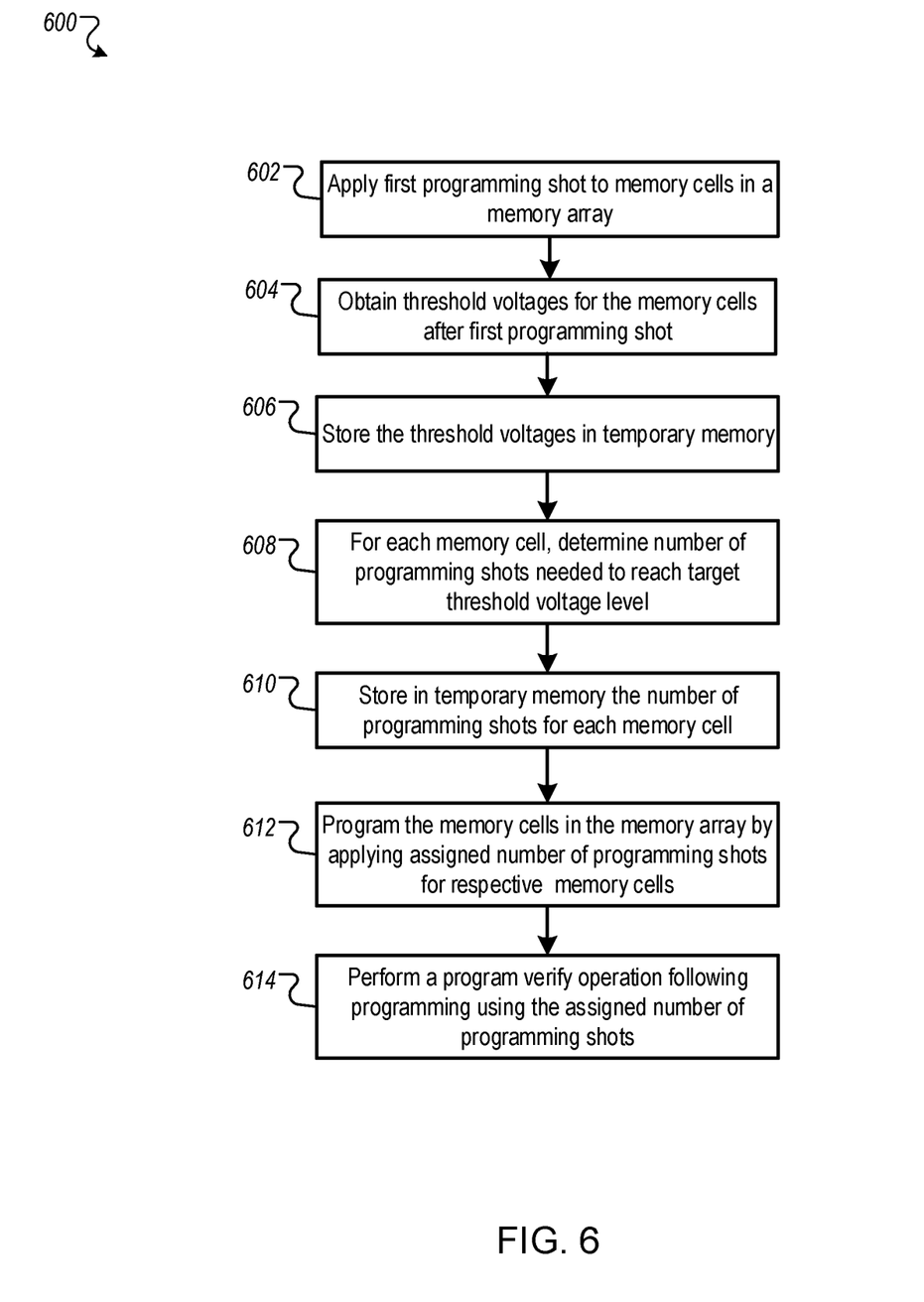
FIG. 6 illustrates an example of a process for using a memory programming cycle with a pre-verify operation and consecutive programming shots without intermediate program verify operations, according to one implementation.

FIG. 6 illustrates an example of a process for using a memory programming cycle with a pre-verify operation and consecutive programming shots without intermediate program verify operations, according to one implementation. In one implementation, the process 600 is performed by the memory controller 502 to program the memory array 504 using the programming cycle 200. Accordingly, the following sections describe the process 600 with respect to the system 500 and the programming cycle 200. However, in other implementations, the process 600 may be performed by other systems, or by the system 500 using a different programming cycle.

The memory controller 502 executes instructions stored in memory coupled to the memory controller to execute the process 600. As noted previously, these instructions correspond to the functionalities of the memory controller.

At 602, a first programming shot is applied to memory cells in a memory array. For example, the memory controller 502 applies programming shot 202a to memory cells in the memory array 504.

At 604, threshold voltages for the memory cells are obtained after the first programming shot. For example, the memory controller 502 performs the pre-verify operation 206 following the first programming shot 202a. During the pre-verify operation, the memory controller 502 reads the threshold voltage levels of the memory cells.

At 606, the threshold voltages are stored in temporary memory. For example, the memory controller 502 stores the threshold voltage levels of the memory cells, which are read at 604, in caches in the temporary storage 510, e.g., caches 512c-512e. As noted previously, the threshold voltage level for each memory cell may be stored in a separate cache that is associated with the memory cell. Alternatively, threshold voltage levels for several memory cells may be stored in the same cache. The latter may be the case, for example, when the threshold voltage level for these memory cells is the same. In such cases, the memory controller 502 may include additional logic to map the threshold voltage level stored in the single cache to the corresponding memory cells.

At 608, the number of programming shots needed to reach a target threshold voltage level is determined for each memory cell. For example, the memory controller 502 determines the target threshold voltage level for each memory cell in the memory array 504 that is to be programmed. The memory controller 502 reads the current threshold voltages of the memory cells from the caches in the temporary storage 510. As described previously, in one implementation, the memory controller 502 generates a voltage distribution 222 and groups the threshold voltages of the memory cells into one of N groups 302*a*, 302*b*, 302*c*, up to 302N–1 and 302N. For a memory cell, depending on its associated group and its target threshold voltage level (assuming multiple target threshold voltage levels), the memory controller 502 determines a number of programming shots for the memory cell.

At 610, the number of programming shots for each memory cell is stored in the temporary memory. For example, the memory controller 502 stores the determined numbers of programming shots for the memory cells in the caches in the temporary storage 510, e.g. 512*c*-512*e*. As noted previously, the number of programming shots for each memory cell may be stored in a separate cache that is associated with the memory cell. Alternatively, the number of programming shots for several memory cells may be stored in the same cache. The latter may be the case, for example, when the number of programming shots for these memory cells is the same. In such cases, the memory controller 502 may include additional logic to map the number of programming shots stored in the single cache to the corresponding memory cells.

At 612, the memory cells in the memory array are programmed by applying assigned number of programming shots for respective memory cells. For example, the memory controller 502 programs the memory cells in the memory array 504 by applying, to each memory cell, the number of programming shots that are determined for the memory cell. The memory controller 502 reads out the number of programming shots for each cell from the cache (e.g., 512*c*, 512*d* or 512*e*) associated with the respective memory cell. The memory controller 502 applies the programming shots consecutively without any intermediate program verify operations between the programming shots, e.g., 202*b*, 202, etc., up to 202*n*.

At 614, a program verify operation is performed following programming using the assigned number of programming shots. For example, after applying the final programming shot 202*n*, the memory controller 502 performs the program verify operation 204 to verify whether the memory cells in the memory array 504 have been programmed to their respective target threshold voltage levels.

The disclosed and other examples can be implemented as one or more computer program products, for example, one or more modules of computer program instructions encoded on a computer readable medium for execution by, or to control the operation of, data processing apparatus. The implementations can include single or distributed processing of algorithms. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A method comprising:
obtaining first threshold voltages of one or more memory cells in a memory array, wherein obtaining the first threshold voltages of the one or more memory cells comprises:
determining a distribution of the first threshold voltages of the one or more memory cells, and
grouping the distribution of the first threshold voltages into N groups based on programming speed;
for each memory cell in the one or more memory cells:
identifying a target threshold voltage for the memory cell, and
determining, based on the first threshold voltage of the memory cell, a number of programming shots to reach the target threshold voltage;
applying, to the one or more memory cells, respective number of programming shots determined for the one or more memory cells; and
upon applying the respective number of programming shots to the one or more memory cells, verifying whether respective target threshold voltages for the one or more memory cells are reached.

2. The method of claim 1, wherein obtaining the first threshold voltages of the one or more memory cells comprises:
applying a first programming shot to the one or more memory cells; and
obtaining the first threshold voltages of the one or more memory cells upon applying the first programming shot.

3. The method of claim 1, wherein determining the number of programming shots to reach the target threshold voltage of a memory cell comprises:
identifying a first group of the N groups corresponding to the first threshold voltage of the memory cell; and
determining the number of programming shots to apply to the first group to reach the target threshold voltage of the memory cell.

4. The method of claim 1, wherein obtaining the first threshold voltages of the one or more memory cells further comprises storing the first threshold voltages of the one or more memory cells in a cache memory, and
wherein determining the number of programming shots to reach the target threshold voltage of each memory cell further comprises storing, in the cache memory, respective number of programming shots for each memory cell to reach a corresponding target threshold voltage.

5. The method of claim 4, wherein applying, to the one or more memory cells, the respective number of programming shots comprises:
for each memory cell, reading, from the cache memory, the number of programming shots to reach the respective target threshold voltage; and
applying, to the memory cell in successive operations, the number of programming shots read from the cache memory.

6. The method of claim 1, wherein verifying whether respective target threshold voltages are reached for the one or more memory cells comprises:
upon applying penultimate programming shots to the one or more memory cells, performing a first program verify operation to determine whether respective target threshold voltages are reached for the one or more memory cells; and
applying final programming shots to memory cells that have not reached respective target threshold voltages; and
performing a second program verify operation to determine whether the respective target threshold voltages are reached for the memory cells.

7. The method of claim 1, wherein verifying whether respective target threshold voltages are reached for the one or more memory cells comprises:
upon applying penultimate programming shots to the one or more memory cells, obtaining second threshold voltages of the one or more memory cells;
for each memory cell in the one or more memory cells, determining additional number of programming shots to reach the respective target threshold voltage based on the second threshold voltage of the memory cell;
applying, to the one or more memory cells in successive operations, respective additional number of programming shots; and
upon applying the respective additional number of programming shots to the one or more memory cells, verifying whether respective target threshold voltages are reached for the one or more memory cells.

8. A device comprising:
a memory controller; and
instructions stored in a storage medium that, when executed, are configured the memory controller to perform operations comprising:
obtaining first threshold voltages of one or more memory cells in a memory array, wherein obtaining the first threshold voltages of the one or more memory cells comprises:
determining a distribution of the first threshold voltages of the one or more memory cells, and
grouping the distribution of the first threshold voltages into N groups based on programming speed;
for each memory cell in the one or more memory cells:
identifying a target threshold voltage for the memory cell, and
determining, based on the first threshold voltage of the memory cell, a number of programming shots to reach the target threshold voltage;
applying, to the one or more memory cells, respective number of programming shots determined for the one or more memory cells; and
upon applying the respective number of programming shots to the one or more memory cells, verifying whether respective target threshold voltages for the one or more memory cells are reached.

9. The device of claim 8, wherein obtaining the first threshold voltages of the one or more memory cells comprise:

applying a first programming shot to the one or more memory cells; and obtaining the first threshold voltages of the one or more memory cells upon applying the first programming shot.

10. The device of claim 8, wherein determining the number of programming shots to reach the target threshold voltage of a memory cell comprise:

identifying a first group of the N groups corresponding to the first threshold voltage of the memory cell; and determining the number of programming shots to apply to the first group to reach the target threshold voltage of the memory cell.

11. The device of claim 8, wherein applying the respective number of programming shots to the one or more memory cells comprise:

applying, to the one or more memory cells, the respective number of programming shots in consecutive operations without intermediate program verify operations.

12. The device of claim 8, further comprising a cache memory that is configured to store the first threshold voltages of the one or more memory cells and the respective number of programming shots for each memory cell, wherein the memory controller is configured to apply, to the one or more memory cells, the respective number of programming shots by performing operations comprising:

for each memory cell, reading, from the cache memory, the number of programming shots to reach the respective target threshold voltage; and applying, to the memory cell in consecutive operations, the number of programming shots read from the cache memory.

13. A method comprising:

obtaining first threshold voltages of one or more memory cells in a memory array;

for each memory cell in the one or more memory cells:
identifying a target threshold voltage for the memory cell, and determining, based on the first threshold voltage of the memory cell, a number of programming shots to reach the target threshold voltage;

applying, to the one or more memory cells, respective number of programming shots determined for the one or more memory cells, wherein applying the respective number of programming shots to the one or more memory cells comprises applying, to the one or more memory cells, the respective number of programming shots in successive operations without intermediate program verify operations; and upon applying the respective number of programming shots to the one or more memory cells, verifying whether respective target threshold voltages for the one or more memory cells are reached.

14. The method of claim 13, wherein obtaining the first threshold voltages of the one or more memory cells comprises:

applying a first programming shot to the one or more memory cells; and obtaining the first threshold voltages of the one or more memory cells upon applying the first programming shot.

15. The method of claim 13, wherein obtaining the first threshold voltages of the one or more memory cells further comprises storing the first threshold voltages of the one or more memory cells in a cache memory, and wherein determining the number of programming shots to reach the target threshold voltage of each memory cell further comprises storing, in the cache memory, respective number of programming shots for each memory cell to reach a corresponding target threshold voltage.

16. The method of claim 15, wherein applying, to the one or more memory cells, the respective number of programming shots comprises:

for each memory cell, reading, from the cache memory, the number of programming shots to reach the respective target threshold voltage; and applying, to the memory cell in successive operations, the number of programming shots read from the cache memory.

17. The method of claim 13, wherein verifying whether respective target threshold voltages are reached for the one or more memory cells comprises:

upon applying penultimate programming shots to the one or more memory cells, performing a first program verify operation to determine whether respective target threshold voltages are reached for the one or more memory cells; and applying final programming shots to memory cells that have not reached respective target threshold voltages; and performing a second program verify operation to determine whether the respective target threshold voltages are reached for the memory cells.

18. The method of claim 13, wherein verifying whether respective target threshold voltages are reached for the one or more memory cells comprises:

upon applying penultimate programming shots to the one or more memory cells, obtaining second threshold voltages of the one or more memory cells;

for each memory cell in the one or more memory cells, determining additional number of programming shots to reach the respective target threshold voltage based on the second threshold voltage of the memory cell;

applying, to the one or more memory cells in successive operations, respective additional number of programming shots; and upon applying the respective additional number of programming shots to the one or more memory cells, verifying whether respective target threshold voltages are reached for the one or more memory cells.

\* \* \* \* \*

UNITED STATES PATENT AND TRADEMARK OFFICE
CERTIFICATE OF CORRECTION

PATENT NO. : 9,543,001 B1  
APPLICATION NO. : 14/985622  
DATED : January 10, 2017  
INVENTOR(S) : Lee et al.

Page 1 of 1

It is certified that error appears in the above-identified patent and that said Letters Patent is hereby corrected as shown below:

In the Claims

Claim 8  
Column 16, Line 42, after "configured" insert --to cause--.

Signed and Sealed this  
Twenty-sixth Day of September, 2017

Joseph Matal  
*Performing the Functions and Duties of the*  
*Under Secretary of Commerce for Intellectual Property and*  
*Director of the United States Patent and Trademark Office*